United States Patent
Zhang et al.

(10) Patent No.: US 7,123,106 B2
(45) Date of Patent: Oct. 17, 2006

(54) FREQUENCY OFFSET CORRECTION TECHNIQUES FOR CRYSTALS USED IN COMMUNICATION SYSTEMS

(75) Inventors: Ning Zhang, Milpitas, CA (US); William J. McFarland, Los Altos, CA (US); Mike Galles, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 66 days.

(21) Appl. No.: 11/027,279

(22) Filed: Dec. 30, 2004

(65) Prior Publication Data

US 2006/0145775 A1   Jul. 6, 2006

(51) Int. Cl.
*H03B 5/32* (2006.01)
*H03L 1/02* (2006.01)
*H03L 7/06* (2006.01)

(52) U.S. Cl. .......................... 331/66; 331/18
(58) Field of Classification Search ............ 331/17–18, 331/25, 66, 175; 327/156–159; 329/325; 332/127; 360/51; 375/376; 455/260

See application file for complete search history.

(56) References Cited

U.S. PATENT DOCUMENTS 5,629,649 A * 5/1997 Ujiie ........................ 331/17

* cited by examiner

*Primary Examiner*—David Mis
(74) *Attorney, Agent, or Firm*—Bever, Hoffman & Harms, LLP; Jeanette S. Harms

(57) ABSTRACT

A method and system for pulling a crystal frequency are provided, thereby allowing wireless stations to use less accurate crystal oscillators and dramatically reduce cost. A first frequency offset can be determined using a temperature-based method. This temperature-base method can include detecting a temperature substantially that of the crystal oscillator and then using that temperature to determine the first frequency offset. A second frequency offset using a closed loop frequency estimate-based method can also be determined. This frequency estimate-based method can include synchronizing the crystal frequency to a presumed, accurate frequency of a controlling device to determine the second frequency offset. Both the first and second frequency offsets can be used to pull the crystal frequency. A synthesizer can also be pulled to fine tune a carrier frequency derived from the crystal frequency.

28 Claims, 4 Drawing Sheets

FREQUENCY OFFSET CORRECTION TECHNIQUES FOR CRYSTALS USED IN COMMUNICATION SYSTEMS

BACKGROUND OF THE INVENTION

1. Field of the Invention

The present invention relates to a crystal oscillator and particularly to a system and method of using both open-loop, temperature-based and closed-loop frequency estimate based techniques for pulling the frequency of that crystal oscillator.

2. Description of the Related Art

A wireless personal handy phone system (PHS) frequently uses crystal oscillators to generate a frequency for controlling reception and transmission of signals between terminals. Unfortunately, a crystal oscillator generates a frequency that can vary due to changes in ambient temperature. To overcome this problem, many PHS transceivers include a crystal oscillator as well as associated components to provide temperature compensation of the output frequency. This type of crystal oscillator circuit is called a temperature compensated crystal oscillator (TCXO).

These TCXOs are typically quite accurate, e.g. within as little as +/−0.1 ppm (parts per million) versus +/−20 ppm for a non-TCXO. (Note that a frequency tolerance is the amount of frequency deviation from a particular center frequency at ambient temperature, e.g. referenced at 25 C. This frequency tolerance is defined using a maximum and minimum frequency deviation specified in ppm.) However, the accuracy of such TCXOs is offset by their corresponding manufacturing cost. For example, a TCXO could add upwards of $1 per station, thereby significantly adding to the cost of manufacturing a wireless device. Moreover, recently implemented communication systems can use less exacting frequency calibration. For example, PHS (which is increasingly being used in Asia) can provide high-quality voice and data transmission at low cost, but requires carrier frequency accuracy only within ±3 ppm and digital system clock accuracy of ±5 ppm. Therefore, a need arises for a system and method of tuning the frequency of a crystal oscillator with an accuracy usable in a PHS system.

SUMMARY OF THE INVENTION

Temperature compensated crystal oscillators (TCXOs) are currently used in wireless communication systems to ensure accuracy of frequency. Unfortunately, for wireless stations, the cost of including TCXOs is considerable. In accordance with one aspect of the invention, a method of pulling a crystal frequency is provided, thereby allowing wireless stations to use less accurate crystal oscillators and dramatically reduce cost.

In this method, a first frequency offset using an open loop temperature-based method can be determined. A second frequency offset using a closed loop frequency estimate-based method can also be determined. At least the second frequency offset (or both the first and second frequency offsets) can be used to pull the crystal frequency. In one embodiment, a synthesizer can also be pulled, as necessary, to fine tune a carrier frequency derived from the crystal frequency.

Determining the first frequency offset using the open loop temperature-based method can include detecting a temperature substantially equal to that of the crystal oscillator and then using that temperature to determine a base ppm. Determining the second frequency offset using the closed loop frequency estimate-based method can include synchronizing the crystal frequency to a presumed, accurate frequency of a controlling device. In one embodiment, this synchronizing can be performed using a received packet (e.g. a CCH, TCH, or sync burst transmission) from the controlling device (e.g. a cell station or a base station). CCH packets are long-preamble entities sent on the control channel (a predetermined frequency to which PHS phones listen for connection status and control data). TCH packets (TDMA data packets on a transmission channel) have relatively short preamble data and sync blocks (which provide approximately the same preamble characteristics as CCH packets, but no control data) that occur from time to time on the transmission channel. Synchronizing can include measuring a phase difference between two symbols.

In one embodiment, a current ppm value can be used to determine an associated capacitance value, wherein the current ppm value is related to the base ppm. For example, in one embodiment, the closed loop frequency estimate-based method generates a tdma ppm value, and the current ppm value is the sum of the tdma ppm value and the base ppm value. Once the current ppm value is determined, a variable capacitor can be set based on the capacitance value, wherein the variable capacitor can physically pull the crystal frequency. In some embodiments, the variable capacitor may comprise a plurality of fixed capacitors disposed to be switched into or out of a circuit.

In one embodiment, steps for increasing a current capacitance of the variable capacitor to the capacitance value can be determined, thereby allowing the crystal oscillator to settle between steps. In another embodiment, at least one of the base ppm, the current ppm, and the capacitance value can be overridden, thereby facilitating testing of the system including the crystal oscillator.

In one embodiment, a frequency estimate (i.e. the tdma ppm) may be split into two components: a synthesizer-pulling component tdma_ppm_synth and a crystal-pulling component tdma_ppm_xtal. The crystal-pulling component tdma_ppm_xtal can be accumulated in the accumulator comprising summing component 406 and latch 405 (FIG. 4).

In one embodiment, the value of the crystal-pulling component tdma_ppm_xtal is dependent on whether a cyclic redundancy check (CRC) sent by a controlling device is correct and the tdma_ppm value is likely correct. Therefore, in one embodiment, determining the second frequency offset using the closed loop frequency estimate-based method can include checking the CRC in a packet.

For example, if the CRC is correct and the integer portion of tdma_ppm is greater than 5 ppm, then the tdma_ppm_xtal is equal to the integer portion of the tdma_ppm, and the tdma_ppm_synth is equal to the tdma_ppm minus the tdma_ppm_xtal. In this case, the synthesizer_ppm is equal to the tdma_ppm_synth plus an intentional ppm. This intentional ppm can be based on spur location and the potential ppm range (including crystal ppm temperature and aging effect). If the CRC is correct and the tdma_ppm is less than or equal to 5 ppm, then the tdma_ppm_xtal is forced to zero, and the synthesizer_ppm is equal to the tdma_ppm plus the intentional ppm. On the other hand, if the CRC is incorrect, then the tdma_ppm_xtal is forced to zero, and the synthesizer_ppm is equal to the last synthesizer ppm.

In accordance with another aspect of the invention, a system for pulling a crystal frequency is also provided. This system can include a temperature sensor and a temperature to ppm converter (e.g. a lookup table (LUT)) for receiving input from the temperature sensor. The temperature sensor and the temperature to ppm converter can provide an open loop temperature based estimate to correct the frequency. The system can further include means for generating a tdma ppm signal associated with a frequency estimate, which can provide a closed loop frequency estimate to correct the frequency.

A summing component in the system can combine a base ppm and an accumulated tdma ppm signal, wherein the base ppm can be associated with an output of the temperature to ppm converter (e.g. a LUT) and the accumulated tdma ppm signal can be dependent on the tdma ppm signal and the correctness of a CRC value. In this manner, the system can advantageously compensate for both the open loop temperature based estimate and the closed loop frequency estimate. A ppm to capacitance converter, which is coupled to an output of the summing component, can provide an appropriate capacitive setting for a variable capacitor connected to the crystal oscillator. This setting can determine the capacitance of the variable capacitor, which in turn can affect the frequency of the crystal oscillator.

In one embodiment, the system can further include a first multiplexer to allow selecting between an output of the temperature to ppm converter and a forced value, wherein the multiplexing component provides the base ppm. In another embodiment, the system can further include a second multiplexer to allow selecting between an output of the ppm to capacitance converter and a forced value. A component for saturation compensation can be coupled between the summing component and the ppm to capacitance converter. The saturation component serves to limit the value of the crystal-pulling signal to, for example, ±30 ppm.

In one embodiment, a step component for adjusting a capacitance value can be coupled to an output of the ppm to capacitor converter. This step component can advantageously adjust the capacitive value of the variable capacitor in step increments, thereby allowing time for the crystal oscillator to settle between increments.

DETAILED DESCRIPTION OF THE FIGURES

In some communications systems, a precise carrier frequency and symbol timing (e.g. ±3 ppm) is required. To avoid using an expensive TCXO, the frequency offset of a less accurate crystal oscillator can be advantageously pulled. Notably, the frequency offset of a crystal oscillator can be both temperature and part-to-part dependent. In accordance with one aspect of the invention, two methods can be used to correct the frequency offset of the crystal oscillator, i.e. an open loop temperature-based method and a closed loop frequency estimate-based method.

Open Loop, Temperature-Based Method

Figure 1:
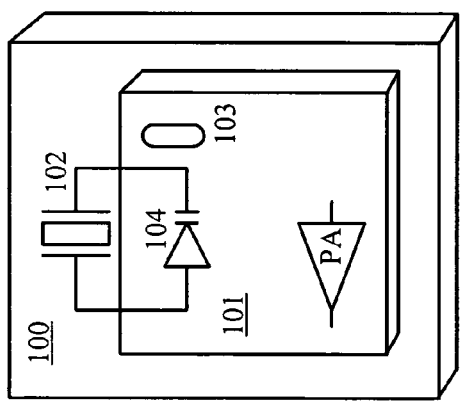
FIG. 1 illustrates a simplified board layout including an off-chip crystal, an on-chip temperature sensor, and an on-chip variable capacitor for pulling the frequency of the crystal based on a temperature detected by the temperature sensor.

In the open loop method, the frequency offset of a crystal oscillator can be calibrated at manufacturing time. Specifically, an on-chip temperature sensor can be used to measure the temperature of the crystal oscillator. FIG. 1 illustrates a simplified board layout 100 including an integrated circuit 101 and a crystal oscillator 102.

Notably, an on-chip temperature sensor 103 can be located as near as possible to crystal oscillator 102, which is off-chip, thereby providing a relatively accurate temperature reading (e.g. within a few degrees). In one embodiment, an on-chip power amplifier PA (or other similar devices), which can generate significant heat, can be located as far as possible from on-chip temperature sensor 103 to ensure an accurate temperature reading. Note that crystal oscillator 102 can also be positioned relatively close to its associated pins of the chip to minimize radiation.

Once the temperature is detected, a ppm vs. temperature look-up table (LUT) can be used to correct the crystal frequency offset. This ppm vs. temperature LUT can be created in various ways. For example, an actual calibration for a specific crystal can be performed at the time of manufacture. In this empirical calibration, the crystal oscillator can be subjected to known temperatures (e.g. in an oven) and the corresponding frequency of the crystal for each temperature can be recorded. In another more cost-effective calibration, a ppm vs. temperature curve provided by the crystal oscillator vendor can be used.

Figure 2:
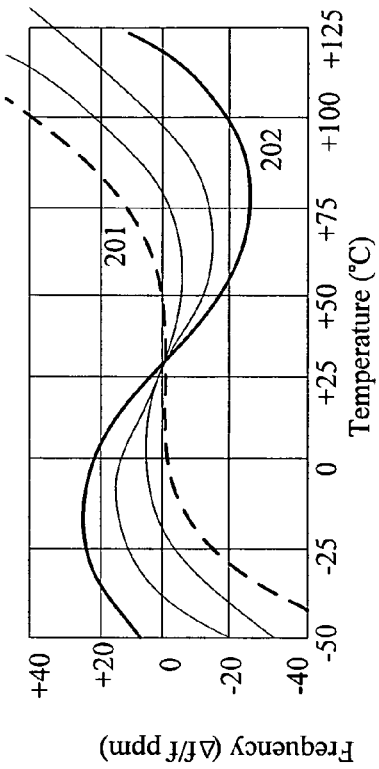
FIG. 2 illustrates a family of exemplary crystal frequency vs. temperature curves.

FIG. 2 illustrates a family of exemplary crystal frequency vs. temperature curves, wherein each curve could represent the characteristics of one crystal oscillator. At one extreme, curve 201 (dashed bold line) has a relatively flat slope (good temperature stability) near room temperature, but is very frequency sensitive at high and low temperatures. At the other extreme, curve 202 (solid bold line) shows greater sensitivity near room ambient, but also provides the overall best temperature stability over wide temperature ranges.

The angle at which the quartz crystal is cut determines the temperature characteristic of a specific crystal. The proper characteristic from this family of curves is selected for each individual crystal oscillator requirement. In a well-designed crystal oscillator, the stability vs. temperature is determined primarily by the temperature characteristic of the crystal oscillator. The crystal oscillator manufacturer must select the crystal characteristics that conform to the oscillator circuit to ensure that the intrinsic stability of the crystal oscillator is not degraded. Sometimes a crystal oscillator vendor may instead merely provide average ppms for certain temperatures, thereby allowing a ppm vs. temperature curve to be generated. The ppm vs. temperature LUT can indicate a first frequency offset for crystal oscillator 102.

Closed Loop Frequency Estimate-based Method

In the closed loop method, the local frequency at the station can be synchronized to a presumed, accurate frequency of a controlling device (e.g. an access point, a cell station, a base station, etc.). In other words, the controlling device is presumed to use a precise crystal oscillator (e.g. a TCXO). Therefore, the local frequency generated by a less accurate crystal oscillator can be synchronized to the precise crystal. This synchronization can include estimating the frequency difference between these two crystals from the received packet (e.g. a beacon signal). In one embodiment, the frequency estimate algorithm can be based on measuring the phase difference between two symbols. To avoid ambiguity, the phase difference ($\Delta\Phi=2\pi*\Delta f*T$) (where T is the symbol transmission period (e.g. approximately 5 µs corresponding to a 192 kHz symbol rate) and $\Delta f$ is a measure of carrier deviation from nominal expressed in ppm) should be less than $\pi/2$. For example, at 1.9 GHz, the ppm should be less than ±25 ppm. This closed loop frequency estimate-based method can indicate a second frequency offset for crystal 102.

Use Open Loop and/or Closed Loop

In accordance with one aspect of the invention, at least one of the open loop temperature-based method and the closed loop frequency estimate-based methods are used to determine an appropriate frequency offset. Once this appropriate frequency offset is determined, an on-chip capacitor can be used to "pull" (i.e. change the load of) the crystal oscillator and thus change its frequency. Specifically, referring back to FIG. 1, a variable capacitor 104 can be connected to the terminals of crystal oscillator 102, wherein changing the load of crystal oscillator 102 using variable capacitor 104 can pull the frequency of crystal oscillator 102. In one embodiment, before pulling is performed, variable capacitor 104 can be calibrated.

Specifically, variable capacitor 104 can have a plurality of settings, e.g. 128 settings, to provide different capacitances. Note that an equivalent circuit for crystal oscillator 102 is a tuned LC circuit having a high Q. Therefore, if additional capacitance is added, then the resonant frequency of that tuned LC circuit can be changed. Thus, adding capacitance effectively "pulls" crystal oscillator 102 from its resonant frequency.

Figure 3:
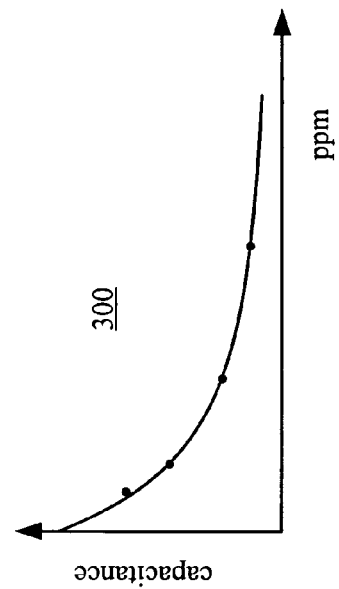
FIG. 3 illustrates an exemplary graph plotting capacitance vs. frequency.

To calibrate variable capacitor 104, the frequency (specifically ppm) at a plurality of capacitances can be measured. These points allow a curve to be generated. FIG. 3 illustrates an exemplary graph 300 plotting capacitance vs. ppm (frequency), wherein each dot on graph 300 represents a capacitive setting of the variable capacitor. After graph 300 is generated, the desired ppm can be used to designate the appropriate capacitance, i.e. the closest capacitive setting, thereby calibrating variable capacitor 104.

Exemplary System Using Open Loop and Closed Loop Methods

Figure 4:
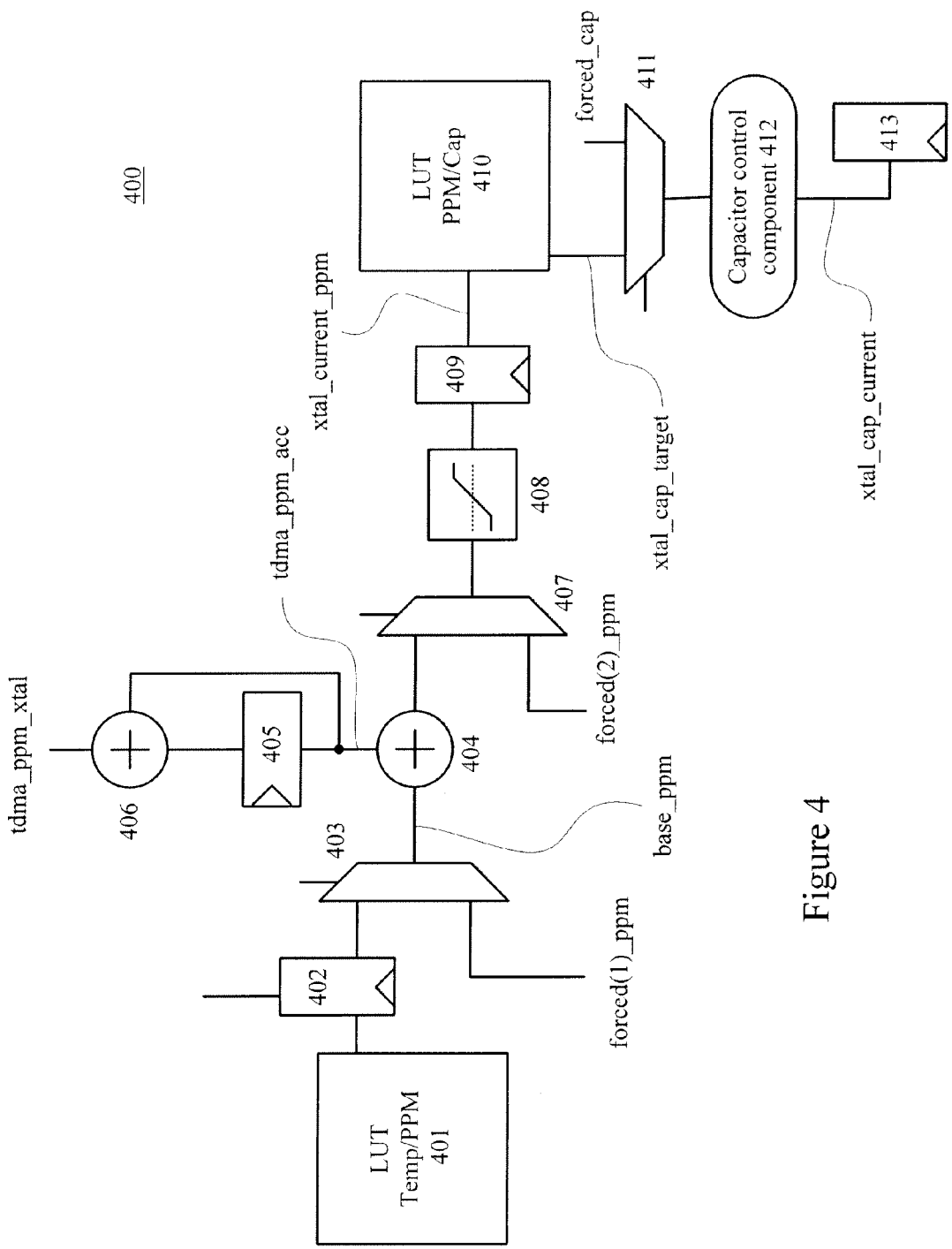
FIG. 4 illustrates a system that can provide crystal pulling using both open loop temperature-based and closed loop frequency estimate-based techniques.

FIG. 4 illustrates a system 400 that can provide crystal pulling using both open loop temperature-based and closed loop frequency estimate-based techniques. In system 400, temp/ppm LUT 401 can provide an initial ppm value that is then stored in a latch 402. In one embodiment, temp/ppm LUT 401 can include a table index of temperatures from −20° C. to 104° C. in 4° steps, table entries of 6-bits in the unit of ppm ranging from −30 to +30 ppm, and a table size of 32×6 bits. A multiplexer 403 can be used to forward the initial ppm value stored in latch 402 or provide a predetermined ppm value (forced(1)_ppm). This forced(1)_ppm value can be used, for example, during manufacturing for debugging.

The selected ppm value, i.e. base_ppm, can be summed with a tdma_ppm_acc value using a summing component 404. In system 400, a latch 405 with a feedback loop and a summing component 406 function as an accumulator receiving closed loop value tdma_ppm_xtal (described in further detail below) and outputting the tdma_ppm_acc value. Note that as $\Delta f$ is repeatedly determined, the correction factor is accumulated (which is the digital equivalent of being integrated) upon each measurement, thus tracking changes and refining the adjustment. In one embodiment (conforming with the above-described LUT 401), these closed loop values can also be 6 bits wide. Latch 405 can be cleared for a temperature only mode or a forced mode (wherein the value is controlled by a register set by means of a software write).

A multiplexer 407 can be used to forward the summed ppm value generated by summing component 404 or provide a predetermined ppm value (forced(2)_ppm). This forced(2)_ppm value can also be used, for example, during manufacturing for debugging. The selected ppm value, i.e. target_ppm, can be provided to a limiter (or "clipper") 408. (Note that system 400 can be designed for a certain maximum range, e.g. +/−30 dBm. Therefore, if system 400 is not operating within this range, then limiter 408 can limit values to the ±30 ppm range). A latch 409 can store the ppm output of limiter 408. This ppm output, i.e. xtal_current_ppm, can be used to in conjunction with ppm/capacitance LUT 410 to determine the appropriate capacitive setting xtal_cap_target. In one embodiment, ppm/capacitance LUT 410 can include a table index of ppms using −30 ppm to +30 ppm in 1 ppm steps, table entries of 8 bits for DAC setting if a varactor is used as a variable capacitor or as selection bits if a family of binary-weighted capacitors is switched into or out of the circuit, and a table size of 61×8 bits.

A multiplexer 411 can be used to forward that capacitive setting xtal_cap_target or a forced_cap value (once again, this forced capacitive value can be useful during manufacturing for debugging) to a capacitor control component 412. Note that changing a capacitive setting can be done using a series of relatively small steps to minimize the possibility of glitches in the frequency. Each step, called an xtal_cap_max_change, can be followed by a predetermined settling time xtal_pull_settle (e.g. 50 µs to settle 85%). In one embodiment, these steps and their associated settling times can be determined using simulation. A latch 413 can store the allowable current capacitive setting, i.e. xtal_cap_current, output by capacitor control component 412.

Note that using both the open loop temperature-based and the closed loop frequency estimate-based techniques can provide quick, coarse pulling of the frequency. That is, the temperature detected by the temperature sensor may be ±1° C. of the actual temperature. Moreover, temperature/ppm LUT 401 and ppm/capacitance LUT 410, which may be based on approximate or averaged data, may result in a target capacitance resulting in an oscillator accuracy of ±1ppm. Therefore, in one embodiment where additional accuracy is desired, fine tuning of the frequency can be provided by pulling a programmable synthesizer (described in reference to step 603B in FIG. 6).

A synthesizer takes a frequency of the crystal oscillator and multiplies that frequency by a predetermined factor (e.g. if the crystal oscillator is 40 MHz, but a carrier signal of 2.4 GHz is desired, then the predetermined factor can be 60). In one embodiment, a fractional synthesizer can be used, wherein the fractional synthesizer can multiply the frequency by any fraction (e.g. up to 20 bits of accuracy). Therefore, if small changes in the frequency are desired, pulling of the programmable synthesizer is particularly advantageous.

Figure 5:
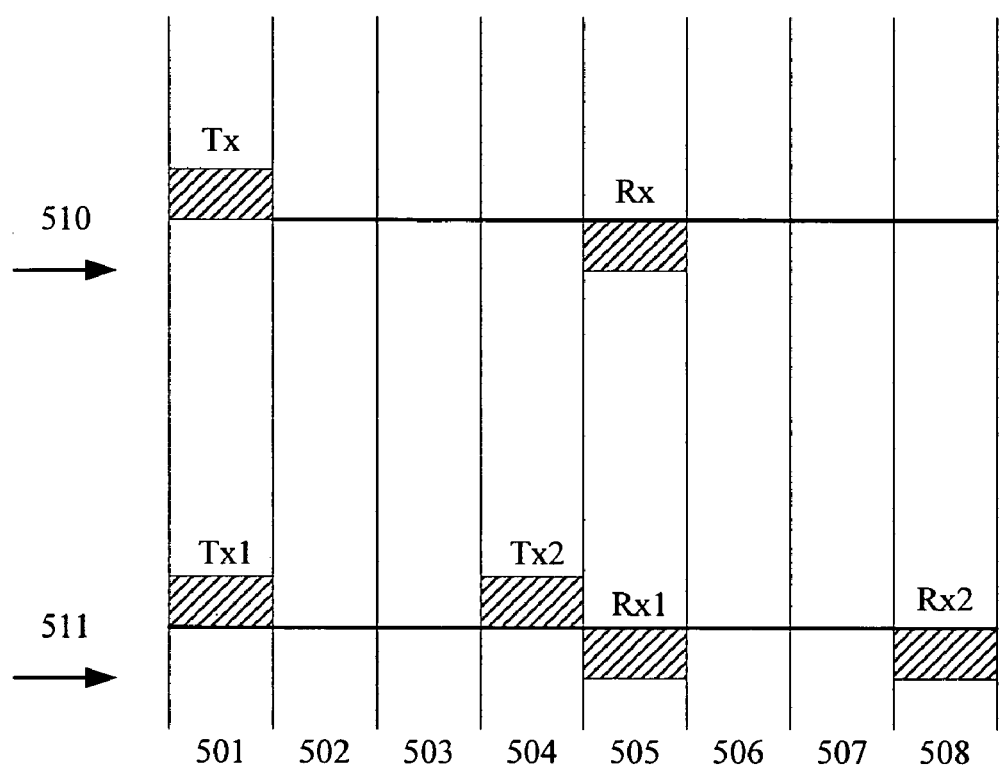
FIG. 5 illustrates a flow chart of various steps that can be performed to provide quick, accurate pulling of a crystal frequency.

In addition, because the synthesizer has a short settling time (e.g. <20 µs), different frequencies can be easily used for transmit and receive signals. For example and referring to FIG. 5, in a TDMA system (i.e. a time division multiple access system in which several devices can share the same frequency band at the same time by letting each device take "turns" sending digital data, wherein each turn is called a time slot), four time slots 501–504 are provided for transmit and four time slots 505–508 are provided for receive. In instance 510, a transmit signal Tx can occur in time slot 501 and a receive signal Rx can occur in time slot 505. However, in instance 511 (e.g. because of roaming), two transmit signals Tx1 and Tx2 occur in time slots 501 and 504, respectively, whereas two receive signals Rx1 and Rx2 occur in time slots 505 and 508, respectively.

In one embodiment, the signals Tx2 and Rx1 can be at different frequencies. For example, the transmit frequency is typically set to the frequency closest to the absolute channel frequency. In contrast, in one embodiment, the receive frequency can be offset from the absolute channel frequency to avoid known spurs from the receiver path (described in further detail below). Therefore, in one embodiment, the open loop temperature-based and closed loop frequency estimate-based techniques (and the synthesizer pulling) can be performed for each packet.

Note that a packet conforming to the PHS standard also includes a cyclic redundancy check (CRC) value that can detect corruption in the reception. Specifically, by recalculating the CRC and comparing it to the value originally received, the receiver can detect some types of reception errors. In one embodiment, the frequency estimate (i.e. a measured ppm deviation from a decoder)(also called the tdma_ppm) may be split into two components: a synthesizer-pulling component tdma_ppm_synth and a crystal-pulling component tdma_ppm_xtal. The crystal-pulling component tdma_ppm_xtal is accumulated in the accumulator comprising summing component 406 and latch 405 (FIG. 4).

In one embodiment, the value of the crystal-pulling component tdma_ppm_xtal is dependent on whether the CRC is correct and the tdma_ppm value from the modem.

For example, if the CRC is correct and the integer portion of tdma_ppm is greater than 5 ppm, then for crystal pulling, tdma_ppm_xtal=the integer portion of tdma_ppm and for synthesizer pulling, tdma_ppm_synth=tdma_ppm−tdma_ppm_xtal and synthesizer_ppm=tdma_ppm_synth+intentional_ppm.

If the CRC is correct and the tdma_ppm is less than or equal to 5 ppm, then for crystal pulling, tdma_ppm_xtal=0 and for synthesizer pulling, synthesizer_ppm =tdma_ppm+intentional_ppm.

On the other hand, if the CRC is incorrect, then for crystal pulling, tdma_ppm_xtal=0 and for synthesizer pulling, synthesizer_ppm=last_synthesizer_ppm.

Note that the above-referenced intentional_ppm can be set by software. In one embodiment, the intentional_ppm is channel dependent and is used for receive only.

For example, in a CCH scan mode on a control channel, the intentional_ppm can be based on spur location and the potential ppm range (including crystal ppm temperature and aging effect). (Note that the CCH scan mode is a phase of PHS operation in which a handset is listening for so-called CCH packets on a control channel. CCH packets include a relatively long preamble and may serve to synchronize the handset time and frequency reference to a base station.) For each possible control channel, an intentional ppm offset can be selected such that with any ppm in the potential range, the preamble tones (i.e. 24 kHz and −72 kHz) will not fall on the DC or the spur frequency.

On a traffic channel, the intentional_ppm can be based on spur location and potential ppm range (+/−2 ppm). For each traffic channel, a ppm offset can be selected such that with any ppm in the potential range, the preamble tones (i.e. 24 kHz and −72 kHz) will not fall on a spur frequency.

An LMS matrix (which is described in U.S. patent application Ser. No. 11/027,280, entitled "JOINT SYNCHRONIZATION AND IMPAIRMENTS ESTIMATION USING KNOWN DATA PATTERNS", filed by Atheros Communications, Inc. on Dec. 30, 2004, and incorporated by reference herein) can be constrained to search for the frequency offset from (intentional_ppm −2 ppm) to (intentional_ppm 2 ppm), and the TDMA can send the ppm offset to the appropriate hardware to bias the frequency offset estimation correctly.

Figure 6:
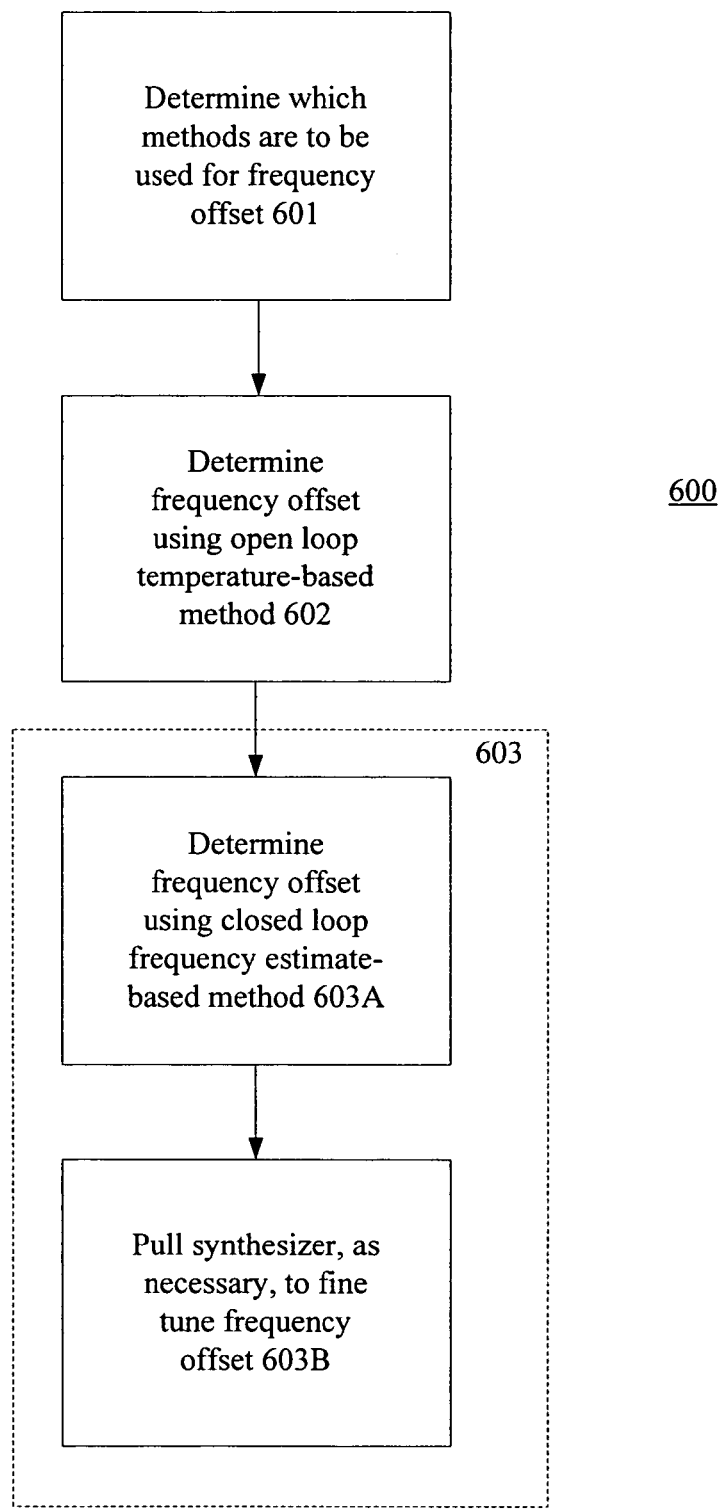
FIG. 6 illustrates a summary flow chart of various steps that can be performed to provide quick, accurate pulling of a crystal frequency.

FIG. 6 illustrates a summary flow chart 600 of various steps that can be performed to provide quick, accurate pulling of a crystal frequency. Step 601 can determine whether one or all of the above-described methods (or overriding values set by software) are to be used for frequency offset. Step 602 can determine the frequency offset using the open loop temperature-based method. Step 603, representing both steps 603A and 603B, can determine the frequency offset using the closed loop frequency estimate-based method. In one embodiment, step 603A can be performed if the CRC is correct and an integer portion of the tdma_ppm is greater than a predetermined value, e.g. 5. In step 603B, the tdma_ppm_synth can be used to fine tune a carrier frequency offset by pulling the synthesizer.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

Accordingly, it is intended that the scope of the invention be defined by the following Claims and their equivalents.

The invention claimed is:

1. A method of pulling a crystal frequency of a crystal oscillator, the method comprising:

determining a first frequency offset using an open loop temperature-based method;

determining a second frequency offset using a closed loop frequency estimate-based method; and selectively using one of the first frequency offset, a combination of the first frequency offset and the second frequency offset, a forced value offset, and a combination of the forced value offset and the second frequency offset to pull the crystal frequency.

2. The method of claim 1, wherein determining the second frequency offset using the closed loop frequency estimate-based method includes:

synchronizing the crystal frequency to a presumed, accurate frequency of a controlling device.

3. The method of claim 2, wherein synchronizing can be performed using a received packet from the controlling device.

4. The method of claim 3, wherein the received packet is one of a CCH packet, a TCH packet, and a sync burst packet.

5. The method of claim 2, wherein the controlling device includes one of an access point, a cell station, and a base station.

6. The method of claim 2, wherein synchronizing can include measuring a phase difference between two symbols.

7. A method of pulling a crystal frequency of a crystal oscillator, the method comprising:

determining a first frequency offset using an open loop temperature-based method;

determining a second frequency offset using a closed loop frequency estimate-based method;

using at least the second frequency offset to pull the crystal frequency; and pulling a synthesizer, as necessary, to fine tune a carrier frequency derived from the crystal frequency.

8. A method of pulling a crystal frequency of a crystal oscillator, the method comprising:

determining a first frequency offset using an open loop temperature-based method;

determining a second frequency offset using a closed loop frequency estimate-based method; and using at least the second frequency offset to pull the crystal frequency, wherein determining the first frequency offset using the open loop temperature-based method includes:

detecting a temperature substantially that of the crystal oscillator; and using the temperature to determine a base ppm.

9. The method of claim 8, wherein using the temperature to determine the base ppm includes referring to a lookup table (LUT).

10. The method of claim 8, wherein using at least one of the first and second frequency offsets includes:

using a current ppm value to determine an associated capacitance value, the current ppm value being related to the base ppm; and setting a capacitor based on the capacitance value, wherein the capacitor can physically pull the crystal frequency.

11. The method of claim 10, wherein the current ppm value is substantially equal to the base ppm value.

12. The method of claim 10, wherein the closed loop frequency estimate-based method generates a tdma ppm value, and wherein the current ppm value is the sum of the tdma ppm value and the base ppm value.

13. The method of claim 10, wherein using the first and second frequency offsets further includes:

determining steps for increasing a current capacitance of the capacitor to the capacitance value.

14. The method of claim 10, further including overwriting at least one of the base ppm, the current ppm, and the capacitance value.

15. A method of pulling a crystal frequency of a crystal oscillator, the method comprising:

determining a first frequency offset using an open loop temperature-based method;

determining a second frequency offset using a closed loop frequency estimate-based method; and using at least the second frequency offset to pull the crystal frequency, wherein determining the second frequency offset using the closed loop frequency estimate-based method includes:

checking a cyclic redundancy check (CRC) value in a packet sent by a controlling device; and if the CRC is correct, then adding a tdma_ppm_xtal to an accumulator and summing that accumulator value with the first frequency offset.

16. A method of pulling a crystal frequency of a crystal oscillator, the method comprising:

determining a first frequency offset using an open loop temperature-based method;

determining a second frequency offset using a closed loop frequency estimate-based method;

using at least the second frequency offset to pull the crystal frequency; and synthesizer pulling, the synthesizer pulling comprising:

determining a synthesizer value based on a correct CRC; and adding an intentional offset to the synthesizer value.

17. The method of claim 16, wherein adding is performed only while receiving.

18. The method of claim 16, wherein adding avoids preamble tones falling on spurs or DC.

19. The method of claim 16, wherein determining the synthesizer value includes determining whether an integer portion of a frequency estimate is greater than a predetermined ppm.

20. The method of claim 19, wherein if the integer portion of the frequency estimate is greater than the predetermined ppm, then the synthesizer value equals the integer portion of the frequency estimate subtracted from the frequency estimate.

21. The method of claim 19, wherein if the integer portion of the frequency estimate is equal to or less than the predetermined ppm, then the synthesizer value equals the frequency estimate.

22. The method of claim 16, wherein if the CRC is incorrect, then a last synthesizer ppm value is used instead of synthesizer pulling.

23. A system for pulling a crystal frequency, the system comprising:

a temperature sensor;

a temperature to ppm converter for receiving input from the temperature sensor;

means for generating a tdma ppm signal associated with a frequency estimate;

a summing component for combining a base ppm and an accumulated tdma ppm signal, wherein the base ppm can be associated with an output of the temperature to ppm converter and the accumulated tdma ppm signal can be associated with the tdma ppm signal; and a ppm to capacitance converter coupled to an output of the summing component.

24. The system of claim 23, wherein at least one of the temperature to ppm converter and the ppm to capacitance converter includes a lookup table.

25. The system of claim 23, further including a multiplexing component to allow selecting between an output of the temperature to ppm converter and a forced value, wherein the multiplexing component provides the base ppm.

26. The system of claim 23, further including a multiplexing component to allow selecting between an output of the ppm to capacitance converter and a forced value.

27. The system of claim 23, further including a component for saturation compensation coupled between the summing component and the ppm to capacitance converter.

28. The system of claim 23, further including a step component for adjusting a capacitance value, the step component being coupled to the ppm to capacitor converter.

* * * * *